United States Patent
Thomas, Jr. et al.

(10) Patent No.: US 10,025,889 B2
(45) Date of Patent: Jul. 17, 2018

(54) STRESS AMPLIFICATION FACTOR ANALYSIS METHODOLOGY FOR ASSESSING FATIGUE PERFORMANCE OF THREADED CONNECTORS

(71) Applicant: Vetco Gray Inc., Houston, TX (US)

(72) Inventors: Micah Antonio Thomas, Jr., Houston, TX (US); Jeffrey Allen Raynal, Houston, TX (US); Thomas Lowell Steen, Houston, TX (US); Joseph William Pallini, Houston, TX (US); Xichang Zhang, Houston, TX (US); Baozhi Zhu, Houston, TX (US)

(73) Assignee: VETCO GRAY, LLC, Houston, TX (US)

( * ) Notice: Subject to any disclaimer, the term of this patent is extended or adjusted under 35 U.S.C. 154(b) by 874 days.

(21) Appl. No.: 14/493,843

(22) Filed: Sep. 23, 2014

(65) Prior Publication Data

US 2015/0127308 A1    May 7, 2015

Related U.S. Application Data

(60) Provisional application No. 61/900,849, filed on Nov. 6, 2013.

(51) Int. Cl.
*G06F 17/10* (2006.01)
*G06F 17/50* (2006.01)

(52) U.S. Cl.
CPC .......... *G06F 17/5009* (2013.01); *G06F 17/10* (2013.01); *G06F 17/5018* (2013.01)

(58) Field of Classification Search
CPC .................................................. G06F 17/5018
USPC ............................................................ 703/2
See application file for complete search history.

(56) References Cited

U.S. PATENT DOCUMENTS

| | | | |
|---|---|---|---|
| 8,504,308 B2 | 8/2013 | Li et al. | |
| 8,590,641 B2 | 11/2013 | Khemakhem et al. | |
| 2008/0319720 A1* | 12/2008 | Ellis | F16L 15/004 703/2 |
| 2012/0323540 A1* | 12/2012 | Naito | B60C 99/006 703/2 |
| 2014/0049045 A1* | 2/2014 | Yoshikawa | F16L 15/001 285/333 |

(Continued)

OTHER PUBLICATIONS

International Search Report and Written Opinion issued in connection with corresponding PCT Application No. PCT/US2014/061505 dated Feb. 18, 2015.

(Continued)

*Primary Examiner* — Andy Ho
(74) *Attorney, Agent, or Firm* — Hogan Lovells US LLP

(57) ABSTRACT

A computer-implemented method is disclosed for characterizing a threaded coupling such as between two tubular members, e.g., casing segments employed in the field of oil and gas recovery. In one embodiment, a virtual model of the coupling is generated, and the virtual model is re-arranged to simulate plastic deformation of at least part of the coupling. The re-arranged model is analyzed to derive a stress/strain distribution of the coupling subject to subsequent loading, and an SAF (stress amplification factor) is determined from the analysis that reflects the effect of cyclic loading of the coupling. The method facilitates a thorough assessment of the performance of the coupling in fatigue.

21 Claims, 16 Drawing Sheets

(56) References Cited

U.S. PATENT DOCUMENTS

2014/0358494 A1* 12/2014 Imai .................. G06F 17/5018
703/1

OTHER PUBLICATIONS

M.B. Allen, "Finite Element Analysis of Bending in a Threaded Connector for a 5 1/2-in. Marine Riser", Annual Offshore Technology Conference, Houston, TX, May 7, 1984, Journal vol. 2, Conference 16.

J. Mackerle, "Finite element analysis of fastening and joining: A bibliography (1990-2002)", International Journal of Vessels and Piping, Apr. 1, 2003, pp. 253-271, vol. 80, No. 4.

L.B. Hilbert et al., "Evaluation of Premium Threaded Connections Using Finite-Element Analysis and Full-Scale Testing", Proceedings SPE/IADC Drilling Conference, Feb. 18, 1992, pp. 563-580.

S. Chen, "Finite element analysis of tooth load distribution on P-110S conic threaded connections", International Journal of Pressure Vessels and Piping, Elsevier Science Publishers, Barking, GB, Jan. 21, 2011, pp. 88-93, vol. 88, No. 2.

M B Allen, "Finite Element Analysis of Bending in a Threaded Connector for a 5 1/2-in Marine Riser," Annual Offshore Technology Conference, May 7, 1984, pp. 2-6.

Chinese Office Action dated Mar. 30, 2018 in corresponding CN Application No. 201480061138.0.

* cited by examiner

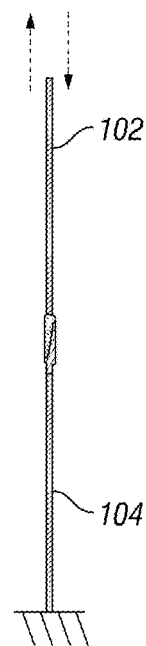
FIG. 4A
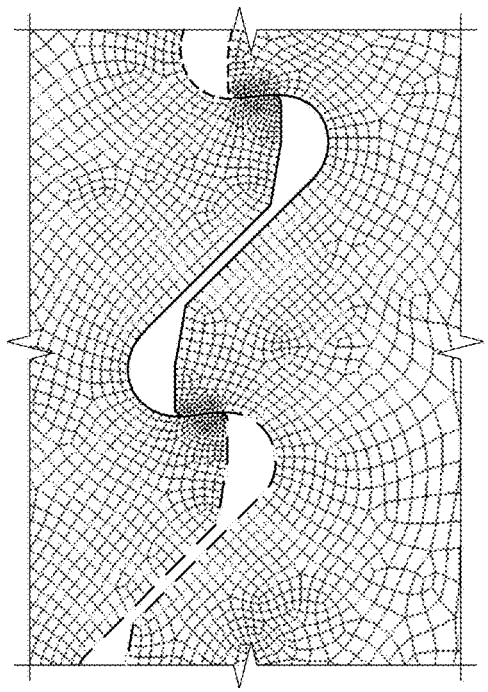
FIG. 4B
| LOAD STEP | DESCRIPTION |
|---|---|
| 1 | PRELOAD |
| 2 | ~0.0125*CAPACITY |
| 3 | ~0.0250*CAPACITY |
| 4 | ~0.050*CAPACITY |
| 5 | ~0.0625*CAPACITY |
| 6 | 0.125*CAPACITY |
| 7 | 0.25*CAPACITY |
| 8 | 0.5*CAPACITY |
| 9 | 1*CAPACITY |
FIG. 5A
| LOAD STEP | FACTOR | TENSION LOAD, KIPS | COMPRESSION LOAD, KIPS |
|---|---|---|---|
| 1 | 0 | 0 | 0 |
| 2 | 0.0125 | 61 | 31 |
| 3 | 0.025 | 123 | 62 |
| 4 | 0.0625 | 306 | 155 |
| 5 | 0.125 | 613 | 309 |
| 6 | 0.25 | 1225 | 619 |
| 7 | 0.5 | 2450 | 1238 |
| 8 | 1 | 4900 | 2475 |
FIG. 5B

| | LOAD STEP | LOAD, KIPS | PEAK STRESS (PSI)- S1 IN TENSION & S3 IN COMPRESSION | CONNECTOR ALT STRESS, PSI | PIPE ALT STRESS, PSI | SAF |
|---|---|---|---|---|---|---|
| COMPRESSION | 8 | -2475 | -47664 | -23804 | -18102 | 1.32 |
| | 7 | -1237 | -23859 | -11923 | -9051 | |
| | 6 | -618 | -11937 | -5856 | -4526 | |
| | 5 | -309 | -6081 | -2892 | -2263 | |
| | 4 | -154 | -3190 | -2468 | -1358 | 3.01 |
| | 3 | -61 | -806 | -1527 | -453 | |
| | 2 | -30 | -3 | -1523 | -453 | |
| | 1 | 0 | -5 | 0 | 0 | |
| TENSION | 1 | 0 | 3363 | 0 | 0 | 3.01 |
| | 2 | 61 | 6099 | 2959 | 896 | |
| | 3 | 123 | 8985 | 2962 | 896 | |
| | 4 | 306 | 17858 | 8954 | 2688 | |
| | 5 | 613 | 34100 | 16242 | 4480 | 3.72 |
| | 6 | 1225 | 68295 | 34195 | 8960 | |
| | 7 | 2450 | 136137 | 67842 | 17920 | |
| | 8 | 4900 | 269563 | 133426 | 35839 | |

*FIG. 9*

| LOAD STEP | DESCRIPTION |
|---|---|
| 1 | PRE LOAD |
| 2 | PEAK LOAD |
| 3 | UN LOAD |
| 4 | PEAK LOAD |
| 5 | UN LOAD |
| 6 | PEAK LOAD |
| 7 | UN LOAD |
| 8 | LOAD 1 |
| 9 | LOAD 2 |
| 10 | LOAD 3 |
| 11 | LOAD 4 |
| 12 | LOAD 5 |
| 13 | LOAD 6 |
| 14 | PEAK LOAD |
*FIG. 12*
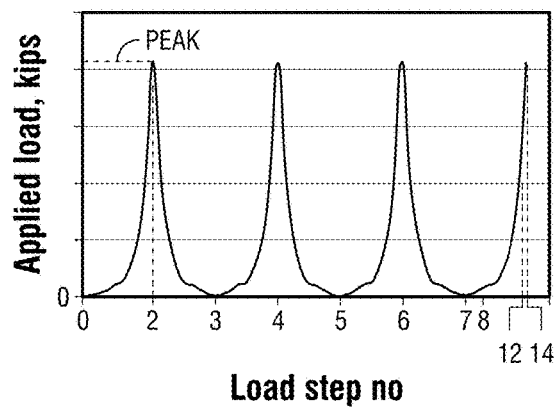
*FIG. 13*
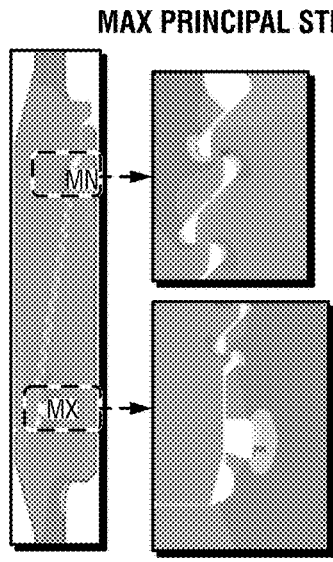
*FIG. 14*
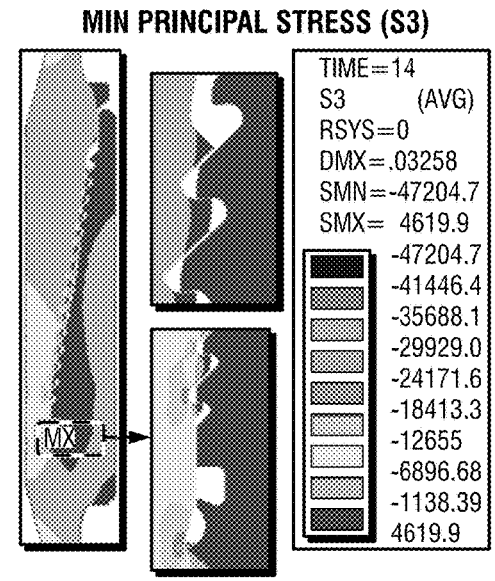
*FIG. 15*

STRESS AMPLIFICATION FACTOR ANALYSIS METHODOLOGY FOR ASSESSING FATIGUE PERFORMANCE OF THREADED CONNECTORS

RELATED APPLICATION

This application claims the benefit of and priority to U.S. Provisional Patent Application No. 61/900,849, titled "Stress Amplification Factor Analysis Methodology for Assessing Fatigue Performance of Threaded Connectors," filed Nov. 6, 2013, which is incorporated herein by reference in its entirety.

BACKGROUND OF THE INVENTION

Field of the Invention

The present invention relates generally to threaded couplings, e.g., between two tubular members such as casing segments employed in the field of oil and gas recovery. In particular, the disclosure relates to the characterization and assessment of threaded couplings according to an anticipated fatigue performance of the threaded couplings subject to various cyclical loading conditions.

Brief Description of Related Art

A variety of wellbore operations include the connection of adjacent tubular members such as pipe, drill string, riser sections, casing segments, and the like. Some of the joints established between the tubular members include a threaded pin connector defined on one of the tubular members, which is engaged with a threaded box connector of another tubular member. Often, the threaded profiles forming the pin and box connectors are cut directly into the base metal of the tubular member. Thus, a cross-sectional area of the threaded profile is smaller than a cross-sectional area of a shank or pipe portion of the tubular member, and the connection is therefore structurally weaker than the pipe portion.

To assess the suitability of tubular members for a particular purpose, an operator often considers a stress amplification factor (SAF) of the connections between the tubular members. The SAF is used to account for the increase in the stresses caused by geometric stress amplifiers that occur within the tubular members, and is equal to the local peak stress in the tubular member divided by the nominal stress in the pipe wall section of the tubular member. Finite element analysis (FEA) techniques have been used to identify and quantify the local peak alternating stress in the connector under purely elastic loading conditions, and the local peak stress is then employed to calculate an SAF for the tubular members. A vendor will often offer this single value for the SAF for characterizing the tubular members, e.g., to help the user assess the relative suitability of design over another.

Equipment in the oilfield, however, is rarely loaded and operated in purely elastic conditions. Tubular members are routinely loaded to stress levels that induce plastic deformations in the connectors. Plastic deformations alter the geometry of the tubular members, and may alter the location and magnitude of the peak stress that the tubular members encounter during subsequent use. Since tubular members are regularly connected and disconnected many times, and reused over time, the initial FEA analysis and resulting SAF become less relevant to the expected performance of the tubular members over time. In light of the above, the inventors recognized the need for a methodology that provides a comprehensive analysis of the tubular members to assess the expected performance of the tubular members under realistic operating conditions.

SUMMARY OF THE INVENTION

A methodology and system are described for assessing the performance of tubular connections subject to cyclical loading conditions that reflects a redistribution of stresses within the tubular connection associated with plastic deformation of the tubular connection. Embodiments of the methodology employ FEA and other computer-assisted techniques.

According to one aspect of the invention, a computer-implemented method of characterizing an operating performance of first and second tubular members that are connectable to one another by a threaded pin connector and a threaded box connector defined respectively thereon includes the steps of: (a) receiving by a computer, a virtual model of the first and second tubular members connected to one another by the threaded pin connector and the threaded box connector; (b) applying by the computer at least one first simulated force to the virtual model, the at least one first simulated force sufficient to induce a simulated plastic deformation in at least one of the first and second tubular members of the virtual model; (c) relieving by the computer the at least one first simulated force from the virtual model such that a portion of a geometry of the virtual model is rearranged by the plastic deformation; (d) applying by the computer at least one second simulated force to the virtual model; and (e) identifying by the computer at least one peak stress in the virtual model induced by the at least one second simulated force.

According to another aspect of the invention, computer-implemented method of characterizing an operating performance of first and second tubular members that are connectable to one another by a threaded pin connector and a threaded box connector defined respectively thereon includes the steps of: (a) receiving by a computer a virtual model into of the first and second tubular members connected to one another by the threaded pin connector and the threaded box connector; (b) performing by the computer a structural capacity analysis on the virtual model to determine an elastic capacity of the virtual model; (c) performing by the computer an elastic analysis on the virtual model; and (d) performing by the computer an elastic-plastic analysis on the virtual model. The elastic analysis includes the steps of: (i) applying a sequence of load steps to the virtual model wherein each load step of the sequence of load steps represents a factor of the elastic capacity; (ii) determining a simulated stress distribution in the virtual model for each load step of the sequence of load steps assuming a hypothetical fully elastic response to simulated loads; and (iii) determining a peak stress at one or more selected locations within a threaded connection for each load step of the sequence of load steps. The elastic-plastic analysis includes the steps of: (i) applying at least one first simulated force to the virtual model, the at least one first simulated force sufficient to induce a simulated plastic deformation in at least one of the first and second tubular members of the virtual model; (ii) relieving the at least one first simulated force from the virtual model such that a portion of a geometry of the virtual model is rearranged by the simulated plastic deformation; (iii) applying a sequence of simulated second forces to the virtual model wherein the sequence of second forces corresponds to the sequence of load steps of the elastic analysis; and (iv) identifying a peak stress in the rearranged virtual model at each of the one or more selected locations induced by each of simulated second force of the sequence of second simulated forces.

BRIEF DESCRIPTION OF THE DRAWINGS

So that the manner in which the features, advantages and objects of the invention, as well as others which will become apparent, are attained and can be understood in more detail, more particular description of the invention briefly summarized above may be had by reference to the embodiment thereof which is illustrated in the appended drawings, which drawings form a part of this specification. It is to be noted, however, that the drawings illustrate only preferred embodiments of the invention and are therefore not to be considered limiting of its scope as the invention may admit to other equally effective embodiments.

FIGS. 4A and 4B are schematic views illustrating aspects of a virtual model the first and second tubular members of FIG. 1 including boundary conditions, elements and nodes of a finite element analysis model of the first and second tubular members.

FIGS. 5A and 5B are tabular diagrams illustrating alternate loading sequences of the elastic stress analysis of FIG. 3A.

FIG. 9 is a tabular view of peak stresses identified within a connector portion and a pipe portion of the virtual model of FIGS. 4A and 4B when subject to the loading sequence of FIG. 5B in elastic tensile and compressive contexts.

FIGS. 12 and 13 are tabular and graphical diagrams illustrating cyclical loading sequences of the elastic-plastic stress analysis of FIG. 3.

FIGS. 14 and 15 are map views of the virtual model of FIGS. 4A and 4B, illustrating stress responses of the virtual model to simulated tensile and compressive loads after the cyclical loading sequences of FIGS. 12 and 13.

DETAILED DESCRIPTION OF THE PREFERRED EMBODIMENT

The present invention will now be described more fully hereinafter with reference to the accompanying drawings which illustrate embodiments of the invention. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numbers refer to like elements throughout, and the prime notation, if used, indicates similar elements in alternative embodiments.

Figure 1:
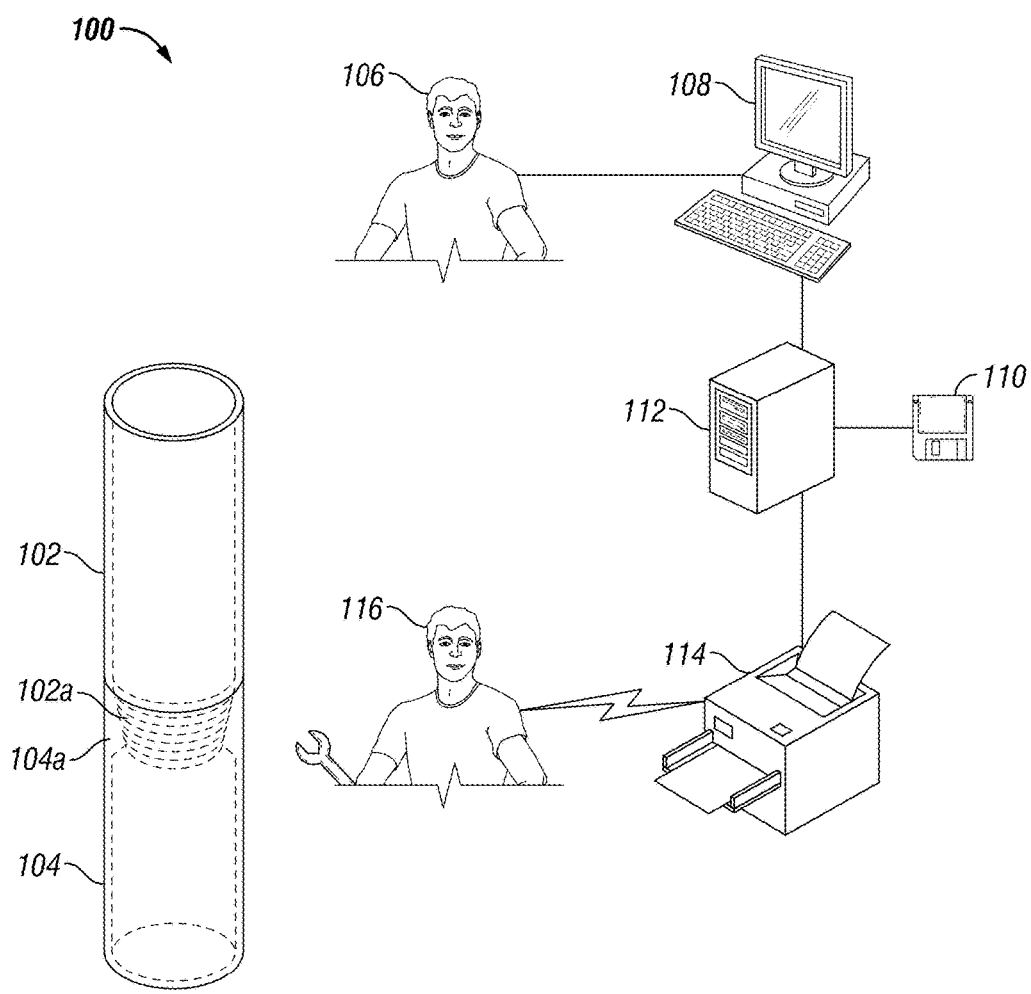
FIG. 1 is a block diagram of a system for providing a characterization of the expected performance of a threaded connection between first and second tubular members under cyclical loading conditions in accordance with an example embodiment of the present disclosure.

FIG. 1 illustrates an example embodiment of a system 100 for providing a characterization of the expected performance of a threaded connection established between first and second tubular members 102, 104 under cyclical loading conditions. In the illustrated embodiment, first and second tubular members 102, 104 are casing components connectable to one another by a threaded pin connector 102a defined on the first tubular member, and a threaded box connector 104a defined on the second tubular member 104. In other embodiments, first and second tubular members comprise other wellbore components such as wellhead housing components, tubing string sections, pipe, riser sections, drill string sections, etc.

The system 100 includes a first user 106, such as an analyst or designer, who operates an input device 108. The input device 108 can include a computer terminal with one or more displays, keyboard mouse, etc., that is commonly used for operating computer aided design (CAD) software and FEA software. In some embodiments, the first user 106 generates a virtual model of the first and second tubular members 102, 104. The virtual model can be, for example, a mathematical model and can be generated with the CAD and FEA software. The first user 106 can use input device 108 to input the virtual model into a computer including one or more processors 112. The one or more processors 112 are operable to determine a stress and strain distribution in the virtual model corresponding to simulated forces applied thereto, as described in greater detail below.

A memory or non-transitory storage medium 110 or media is operably coupled to the one or more processors 112. The non-transitory storage medium 110 or media has one or more computer programs stored thereon and readable by the one or more processors 112. The one or more computer programs can include a set of instructions that, when executed by the one or more processors 112, causes the one or more processors 112 to perform the operations of: analyzing the virtual model in the elastic and elastic-plastic analyses described below; and generating a report summarizing the analyses performed. The non-transitory storage medium 110 or media can serve to store report data and/or CAD and FEA software to facilitate to generation of the virtual model and performance of the elastic and elastic-plastic analyses.

An output device 114 is operably coupled to the one or more processors 112. As illustrated, the output device 114 is a printer operable to produce a hard copy of the report summarizing the analyses. In other embodiments, output device 114 comprises a computer display, a file generation software module, or other mechanism to communicate the report to a second user 116. The second user 116 can be an operator or end-user who makes decisions about how to employ first and second tubular members 102, 104 in practice.

It is to be understood by those skilled in the art that the invention is not limited to the exact details of construction, operation, exact materials, or embodiments shown and described, as modifications and equivalents will be apparent to one skilled in the art. For example, although discussed as steps in a computerized process, steps of the present invention may also be accomplished manually. In addition, although aspects of the present invention have been described with respect to a computer, a computer device, a computer system, or processor executing program product or software that directs the functions of embodiments of the present invention, it should be understood by those skilled in the art that the present invention can be implemented as a program product for use with various types of data processing systems as well. Computer programs defining the functions of embodiments of the present invention, for example, can be delivered to a data processing system via a variety of signal-bearing media, which include, without limitation, non-rewritable storage media (e.g., CD-ROM, DVD-ROM), rewritable storage media (e.g., floppy disks, hard drive disks, CD-R, or rewritable ROM media), and communication media, such as digital and analog networks. It should be understood, therefore, that such signal-bearing media, when carrying or embodying computer readable instructions that direct the functions of embodiments of the present invention, represent alternative embodiments of the present invention. In the drawings and specification, there have been disclosed illustrative embodiments of the invention and, although specific terms are employed, they are used in a generic and descriptive sense only and not for the purpose of limitation. Accordingly, the invention is therefore to be limited only by the scope of the appended claims.

Figure 2A:
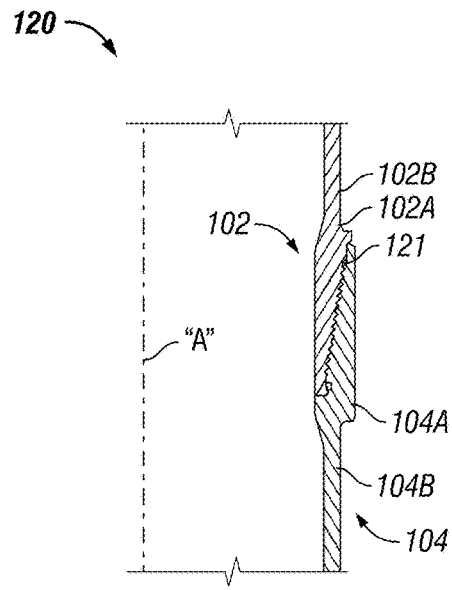
FIG. 2A is a partial, cross-sectional view of the threaded connection of FIG. 1 established between pin and box connectors of the first and second tubular members.
Figure 2B:
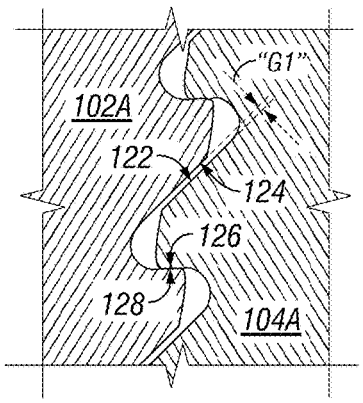
FIGS. 2B and 2C are respectively enlarged views of a threaded profile and an axial load shoulder of the threaded connection illustrated of FIG. 2A.
Figure 2C:
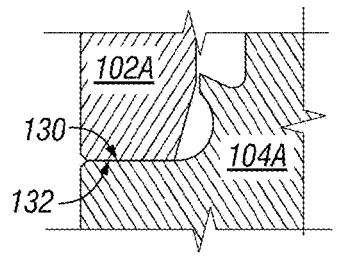

Referring to FIGS. 2A through 2C, an example geometry and configuration of first and second tubular members 102, 104 are described for which an example characterization is made and described herein. First and second tubular members 102, 104 are arranged around a longitudinal axis "A," and a threaded connection 120 is established between the threaded pin connector 102a and the threaded box connector 104a of the first and second tubular members 102, 104. The threaded connection 120 is established between fourteen threads on the threaded pin connector 102a and fifteen threads on the threaded box connector 104a. As described herein, the threads are numbered from top to bottom, e.g., in a direction from the first tubular member 102 toward the second tubular member 102. The relative positions described in this specification, such as "top" an "upper" or "bottom" and "lower" are for description only as the components described can be used in any orientation.

As illustrated in FIG. 2B, a gap "$G_1$" is defined between an upward-facing inclined thread face 122 of the threaded box connector 104a and a downward-facing inclined thread face 124 of the threaded pin connector 102a when the first and second tubular members 102, 104 are pre-loaded and/or loaded with axial compressive forces. When compressively loaded, an upward facing thread face 126 of the threaded pin connector 102a engages a downward-facing thread face 128 of the threaded box connector, and a primary load shoulder 130 (FIG. 2C) defined at a lower region of the threaded box connector 104a engages a lower end 132 of the threaded pin connector 102a. When the first and second tubular members 102, 104 are loaded with axially tensile forces, axial movement and deformation of the threaded profile can produce a gap "$G_2$" (see FIG. 7) between thread faces 126, 128.

The first and second tubular members 102, 104 each include a respective shank or pipe portion 102b, 104b extending from the threaded connection 120. In the illustrated example, the pipe portions 102b, 104b each include a 28-inch outer diameter and a 26.5-inch inner diameter such that a cross sectional area of the pipe portions is about 66.77 $in^2$ in a plane normal to the longitudinal axis "A." This cross-sectional area is employed for calculating a pipe stress in the pipe portions 102b, 104b as described below. One skilled in the art will appreciate, axial loads applied to one or more of the pipe portions 102b, 104b impart stresses to threaded connection 120. As described herein, an SAF represents a ratio of a peak stress within the threaded connection 120 and a pipe stress within pipe portions 102a, 104a for a predetermined loading condition.

In other embodiments, first and second tubular members 102, 104 exhibit alternate geometries for alternate connector designs. The particular geometry and certain mechanical properties of the threaded connection 120 are assessed by employing methods and techniques in accordance with the present disclosure.

Figure 3A:
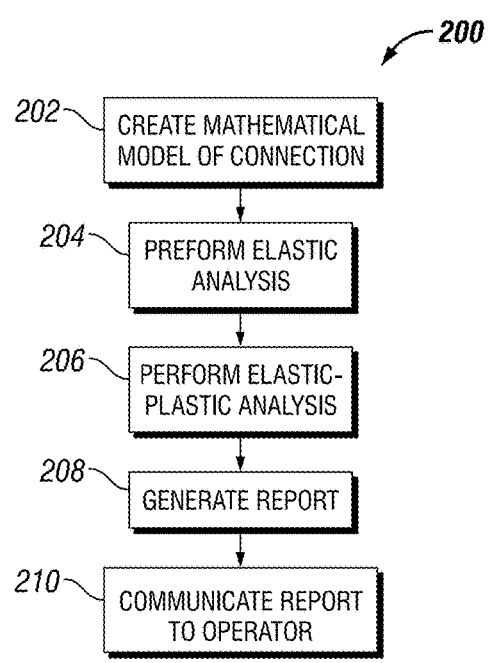
FIG. 3A is an overview flow diagram of a method for providing the characterization of the first and second tubular members of FIG. 1 including an elastic analysis, an elastic-plastic analysis and a report generating step in accordance with another example embodiment of the present disclosure.

Referring now to FIG. 3A, an overview of a process 200 for assessing a fatigue response of the design of the threaded connection 120 (FIG. 1) is described. Certain steps of the process 200 are described in more detail with reference to FIG. 3B. The process 200 begins at step 202 where a virtual model of the threaded connection 120 is generated. The virtual model may be a 2-Dimensional representation of the essential geometry of the threaded connection 120 (see FIGS. 4A and 4B). Alternatively, the virtual model may be a full 3-Dimensional representation of the threaded connection 120 and first and second tubular members 102, 104.

Next, at step 204, the virtual model is employed to perform an elastic analysis of the threaded connection 120. The elastic analysis includes determining a simulated stress distribution in the virtual model assuming a hypothetical fully elastic response to simulated forces, (see FIGS. 5A through 11). Various SAF values for different loading conditions and at different locations within the threaded connection 120 are determined by the elastic analysis.

An elastic-plastic analysis is performed in step 206. The elastic-plastic analysis is characterized by the application of simulated loads to the virtual model that are expected to induce partial yielding in the material of threaded connection 120, and by determining the stress response to subsequent simulated forces applied the virtual model that accounts for plastic deformations expected in the virtual model (see FIGS. 12 through 18D). Peak stresses at various locations within the threaded connection 120 are determined by the elastic-plastic analysis.

Next, at step 208, a report is generated that summarizes aspects of the elastic and elastic-plastic analyses of steps 204, 206. The report can include graphical views of peak stresses plotted against applied loads (see FIGS. 18A-18D) for the four locations within the threaded connector 120 identified as having the peak stresses with largest magnitude observed in the analyses of steps 204, 206.

Next, in step 210, the report is communicated to a second user 116 (FIG. 1) such as an operator. The operator can review the report, and evaluate the suitability of the particular design of the first and second tubular members 102, 104 to a particular purpose, and/or make decisions about how to employ the first and second tubular members 102, 104. Alternatively, the report can be evaluated by the first user 106, who can proceed to any post-processing activities, and/or proceed to redesign the threaded connection, if necessary.

The Virtual Model

Referring now to FIGS. 4A and 4B, a virtual model can be generated using CAD and FEA software tools as understood in the art. In the example embodiment discussed herein, the virtual model is a 2-D representation of the threaded connection 120 and the pipe portions 102b, 104b of the first and second tubular members 102, 104. Since the first and second tubular members 102, 104 are substantially symmetrical about axis "A," a 2-D cross-section of one lateral side of the threaded connection 120 will yield sufficient information for evaluating the threaded connection.

Various material properties are assigned to the virtual model. In the example embodiment discussed herein, a Young's modulus "E", Poisson's ration "v", yield strength "$f_y$" and ultimate strength "$f_u$" are assigned to the model as indicated below.

$E=30\times10^6$ psi
$v=0.3$
$f_y=70$ ksi
$f_u=82$ ksi

Other properties such as a coefficient of friction of 0.1 are applied to all contacting surfaces between the first and second tubular members 102, 104. As indicated in FIG. 4A, boundary conditions assigned to the virtual model include an axial constraint at a lower end of the second tubular member 104 and compressive and tensile loads to be applied from an upper end of the first tubular member 102. As indicated in FIG. 4B, a mesh of finite elements are defined within the virtual model. An auto-meshing module can be used to generate the mesh with smaller and more plentiful elements at points of contact, geometric extremes, and other locations of interest in the geometry of the virtual model. In the example embodiment discussed herein, a mesh including 32,790 elements and 94,494 nodes is employed.

The Elastic Analysis

The elastic analysis is characterized by the condition that no plastic deformation occurs regardless of the stresses observed. Even when the yield strength "$f_y$" is exceeded, a linear stress strain curve is presumed, and the virtual model to returns to a pre-stressed geometry when an applied load is removed.

As indicated in FIG. 5B, an initial sub-step 204A to the elastic analysis stem 204 is to perform a structural capacity analysis. The structural capacity analysis determines the external minimum external load required to induce yielding in the threaded connection 120. Before assessing the external load, however, a preload "$F_p$" may be calculated to account for stresses present in the threaded pin and box connectors 102a, 104a due to the torque required to assemble the first and second tubular members to one another. As appreciated by those skilled in the art, the preload "$F_p$" is a function of an applied torque "$T_t$", geometry and frictional characteristics of the threaded connection 120. In the example embodiment described herein, an applied torque "$T_t$" of 26000·12 lbf·in preloads the threaded connection 120 with a preload of 118,531 lbf applied through thread faces 126 (FIG. 2B) and load shoulder primary load shoulder 130 (FIG. 2C). As indicated in FIG. 5A, the preload "$F_p$" can be used as the first of load step in the elastic analysis as described below.

In the structural capacity analysis of step 204A simulated loads can applied to the virtual model in an incremental manner until a peak stress is observed in the virtual model. For example, an initial load can be applied to the upper end of the first tubular member 102 as illustrated in FIG. 4A, and the applied load can be increased in increments until a stress distribution is observed that meets a predetermined criteria. For example, the predetermined criteria may be that an average stress is observed in the virtual model is greater than the yield strength "$f_y$." In the example embodiment described herein, an applied tensile load of 4900 kips generated an average stress in the threaded connection 120 greater than the yield strength "$f_y$" of 70 ksi. A similar analysis performed in the compressive context determined that an applied load of 2475 kips generated an average stress greater than the yield strength.

In other embodiments, the criteria may be that an average stress at a particular predetermined location of interest, such as an individual thread, is observed. The structural capacity analysis of step 204A can include purely analytical steps, and also may include actual stress testing of physical models of the connectors as appreciated by those skilled in the art.

Once the preload "$F_p$" and the connector capacity are determined, the values of the load steps illustrated in FIG. 5B are calculated. Each of the load steps illustrated is an applied load for application to the virtual model in addition to the preload "$F_p$." Each of the load steps is a predetermined portion or "factor" of the capacity. For example, the first load step is a load with a factor of zero. Thus, the first load step (1) is the preload the preload "$F_p$" and no additional applied loads. The last load step (8) is a load with a factor of 1, or the full connector capacity. The intermediate load steps (2-7) are loads with factors selected to produce stress distributions that are significantly different than the stress distributions produced by adjacent load steps. In the illustrated embodiment, the intermediate load steps are not evenly distributed between factors of zero and one. A greater number of load steps are provided for factors of 0.125 or less than greater than 0.125. As illustrated below, the stress response of the connector 120 is more volatile at lower loads, and stabilizes as the loads approach the connector capacity. Thus, more load steps are selected with lower load factors to better describe the more volatile behavior. The load steps are calculated for both tensile and compressive analyses.

Figure 7:
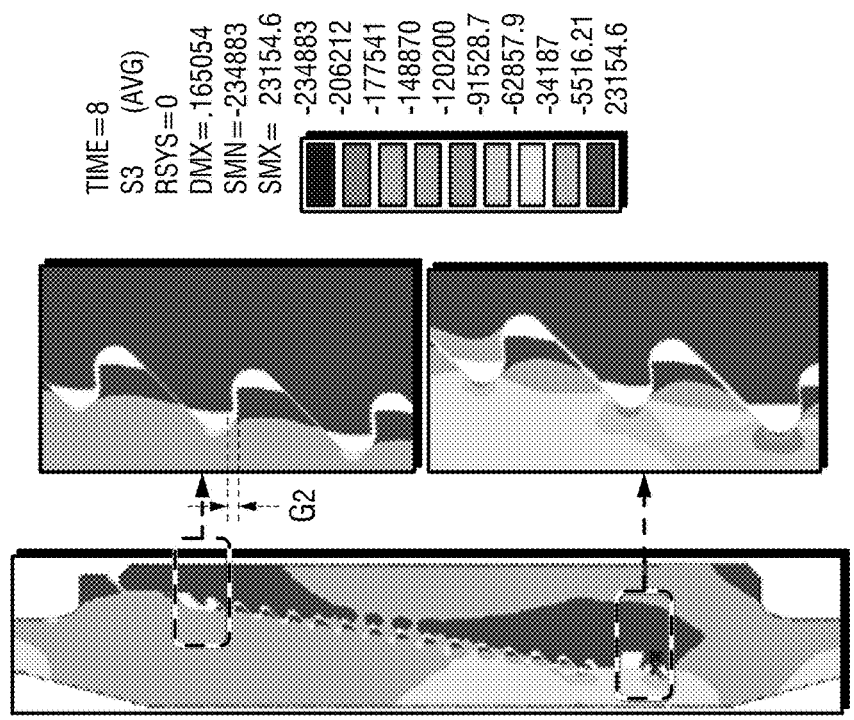
FIGS. 6 and 7 are map views of the virtual model of FIGS. 4A and 4B, illustrating elastic stress responses of the virtual model to simulated tensile and compressive loads, respectively.
Figure 6:
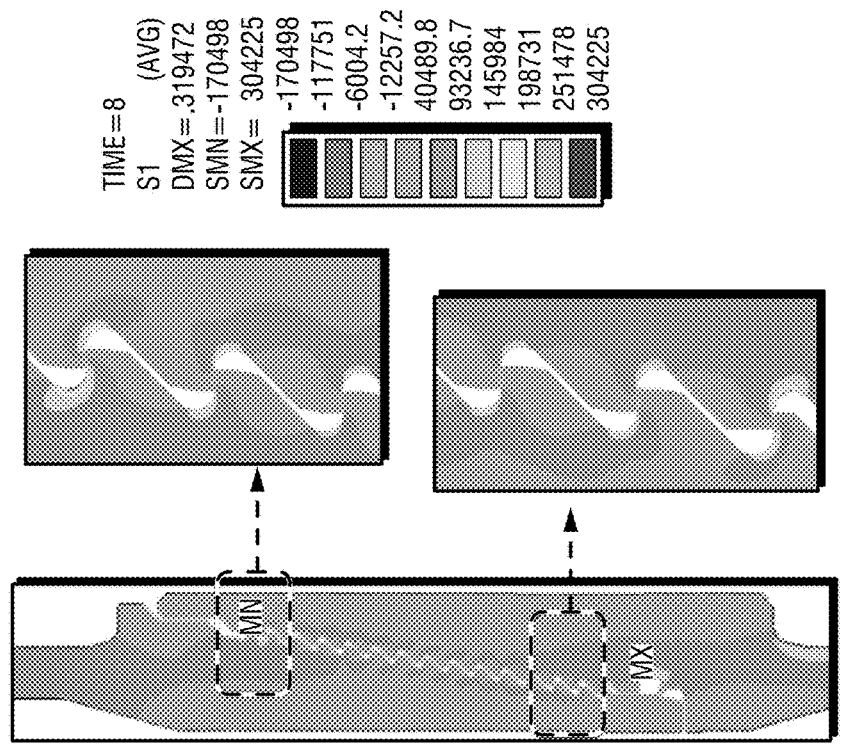

Once the load steps are determined, each load step is individually applied to the virtual model, and a resulting stress distribution is determined for each load step. An example stress distribution is illustrated in FIG. 6 for an applied tensile load of 4900 kips (tensile load step 8). Similarly, an example stress distribution is illustrated in FIG. 7 for an applied compressive load of 2475 kips (compressive load step 8). The maximum principal stress "S1" is observed at or near the o-ring groove 121 when the tensile load step 8 is applied, and the minimum principal stress "S3" is observed at or near the load shoulder 130 when the compressive load step 8 is applied. As appreciated by those skilled in the art, the o-ring groove 121 and the load shoulder 130 are generally not as susceptible to cracking and other failure modes as the threads. The first user 106 (FIG. 1) can evaluate the stress distribution to select specific locations for evaluating the fatigue performance of the threaded connection 120 under environmental loads.

Example locations for evaluation include a weld defined between the threaded pin connector 102a and the pipe portion 102b and a weld defined between the threaded box connector 104a and 104b. Also thread roots on the threaded pin connector 102a and threaded box connector 104a are candidates for evaluation. Thread roots are locations where cracks are likely to initiate due to relatively high stress concentrations. Often, the first two or three threads from the upper and lower ends of the threaded profile are candidates for evaluation since the extremities of the threaded pin and box connectors 102a, 104a are often locations of highest stress concentration. When the first user 106 identifies candidate locations for analysis, the first user may verify that the mesh (FIG. 4B) is sufficiently dense in the areas selected. The mesh density in the selected locations selected can be increased and corresponding stress distributions can be reevaluated for selection in the example embodiment described herein, since the peak stresses observed at the threads can provide more relevant information to a second user 116 than the stresses observed at the o-ring groove 121, the peak stresses within the treads are selected for further analysis as described below.

Figure 8A:
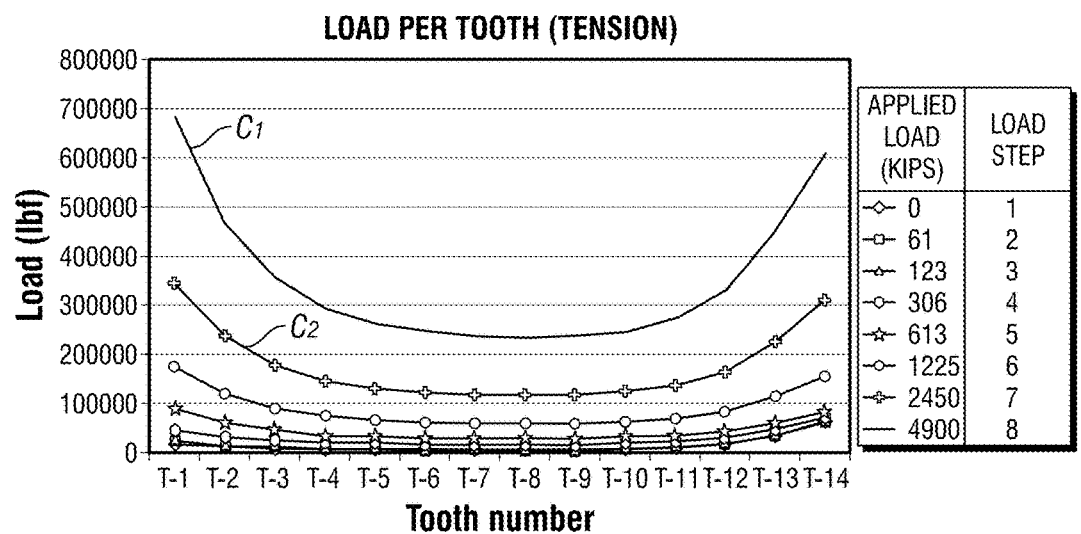
FIGS. 8A and 8B are graphical views illustrating a portion of the simulated loads transmitted through each of fourteen engaged threads of the connector portion for each load step in the loading sequence of FIG. 5B.
Figure 8B:
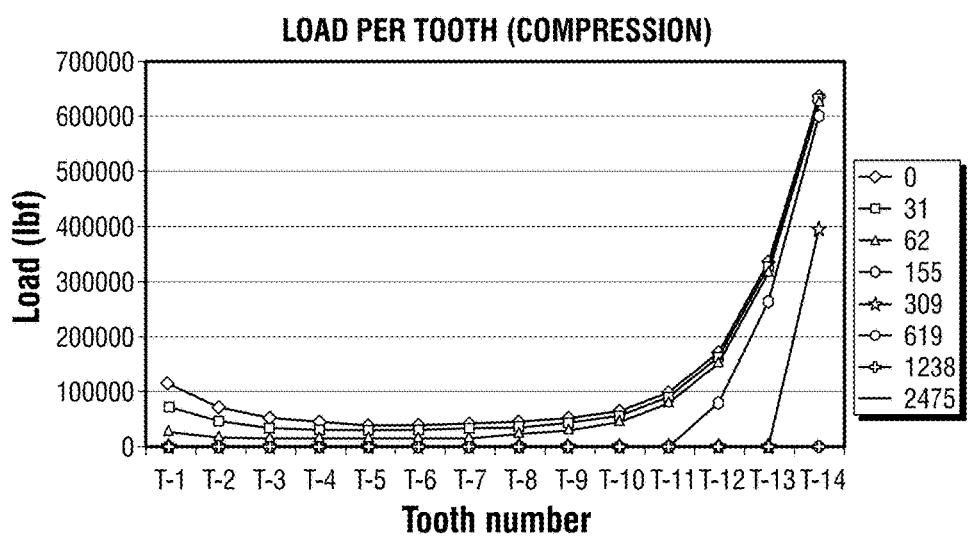
Figure 10:
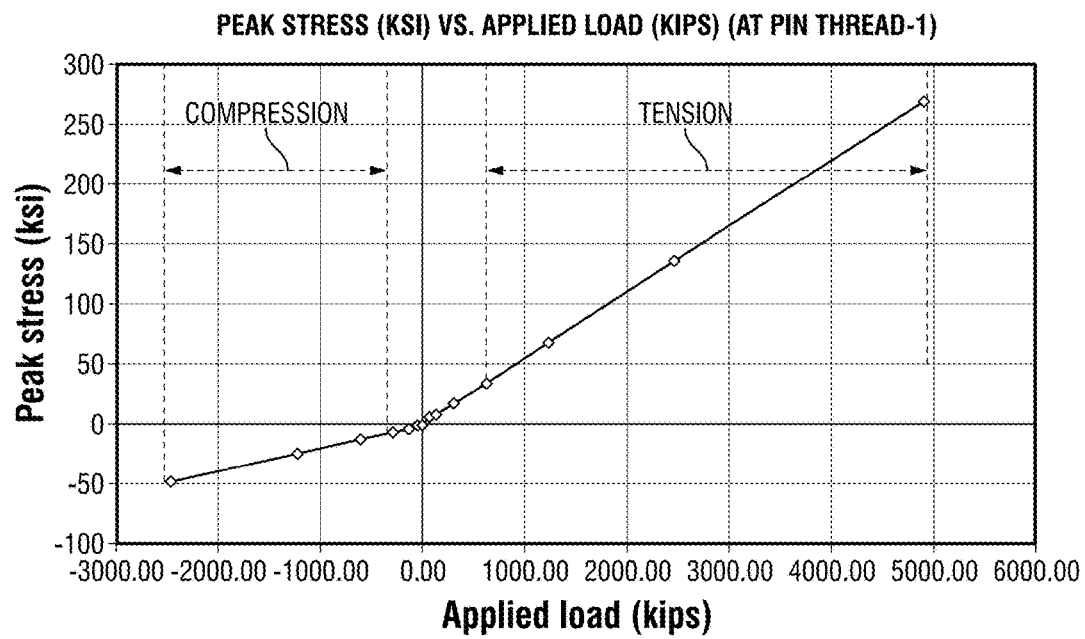
FIGS. 10 and 11 are graphical views of peak stresses identified within a first thread of the connector portion of the virtual model of FIGS. 4A and 4B when plotted against the simulated applied loads of the loading sequences of FIGS. 5A and 5B.
Figure 11:
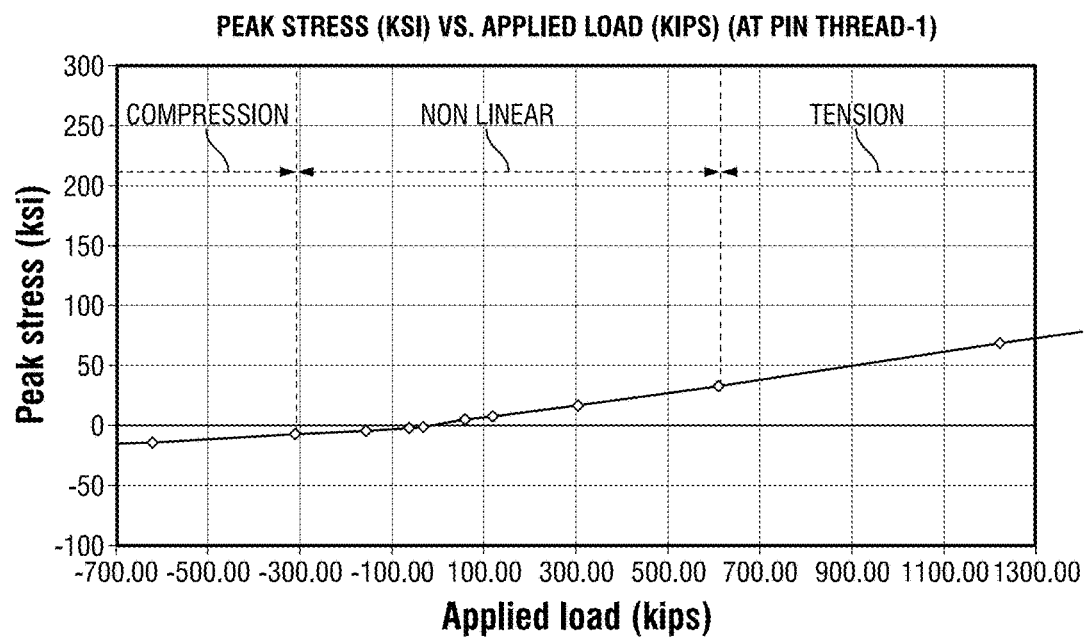

As illustrated in the upper detail of FIG. 6, the threads nearest the o-ring groove 121 exhibit higher tensile stresses than the lower threads illustrated in the lower detail. Similarly, as illustrated in the lower detail of FIG. 7, the threads nearest the load shoulder 130 exhibit higher compressive stresses than the upper threads illustrated in the upper detail. The stress distributions can be analyzed to determine the portion of the applied load transferred through each of the threads. As indicated in FIG. 8A, a first curve "$C_1$" indicates the amount of the 4900 kip load of tensile load step 8 that is transferred through each of the fourteen engaged threads. A second curve "$C_2$" indicates the amount of the 2450 kip load of tensile load step 7 that is transferred through each of the fourteen engaged threads, and the remainder of the curves depicted in FIG. 8A illustrate the amount of the respective loads transferred through the threads for the remainder of the tensile load steps 1 through 6. FIG. 8B illustrates the amount of the loads transferred through each of the thread for the compressive load steps 1 through 8. Each of the curves illustrated in FIGS. 8A and 8B indicate that the uppermost threads (T-1 and T-2), and the lowermost threads (T-13 and T-14) carry more of the applied loads than any of the interior threads (T-3 through T-12).

Further inspection of the stress distributions of the elastic analysis indicates that among the threads, the greatest peak stresses are found in pin thread-1, pin thread-14, box thread-2 and pin thread-2. The peak stresses at these four locations are examined in the example embodiment of the elastic analysis described herein. In other embodiments, more or fewer locations are selected for examination.

As illustrated in FIG. 9, the peak load at pin thread-1 is determined from the stress distribution for each load step and tabulated. A similar table (not shown) is created for each of the other three locations selected for evaluation. The "Load" column in the table of FIG. 9 lists the applied loads of the sixteen load steps in increasing order from the greatest compressive load (compressive load step 8) to the greatest tensile load (tensile load step 8). The "Peak Stress" column lists the peak stress identified at pin thread-1 at each load step. The "Peak Stress" is the first principal stress (S1) in tension, and the third principal stress (S3) in compression if in the same direction as the first principal stress (S1). The "Connector Alt Stress" column lists the connector alternating stress for each load step at pin thread-1. The connector alternating stress represents a change in stress at the from the previous load step. For example, the connector alternating stress for compression load step 6 is −5,856 psi since this is the difference in peak stress between compression load step 6 and compression load step 5. Similarly, the connector alternating stress for tension load step 8 is 133,426 psi since this is the difference in the peak stress between tension load step 8 and tension load step 7. The "Pipe Alt Stress" column lists the alternating stress for each load step within the pipe portions 102b, 104b of the first and second tubular members 102, 104. The pipe alternating stress represents a change in the pipe stress from the previous load step where the pipe stress is calculated as the applied load divided by the cross sectional area (about 66.77 in² as described above) of the pipe portions 102b, 104b.

The SAF column lists stress amplification factors for various portions of the loading sequences. An SAF value can be calculated for each load step by dividing the connector alternating stress by the corresponding pipe alternating stress. The SAF values calculated for the last four load steps in both the compressive and tensile contexts are generally equivalent to the corresponding values, i.e., 1.32 and 3.72, listed in the table of FIG. 8. In some embodiments, the maximum of the four SAF values calculated for these regions is listed. Alternate methods for determining an SAF value are described below with reference to FIGS. 19 and 20. The SAF values listed for the first four load steps, i.e., 3.01, is an average or composite value of each of the load steps.

As illustrated in FIG. 10A, the SAF values generally represent a slope of a portion of the curve generated when the applied load is plotted against the peak stresses. The curve illustrates the behavior of the threaded connection 120 at different portions of the loading sequences. As the curve approaches an applied load near the tensile or compressive capacity at opposite ends of the curve along the horizontal axis, the curve is generally linear. The slope of the curve in these regions is generally equivalent to the SAF values listed in the table of FIG. 8, i.e., 1.32 for the region identified as "Compression" and 3.72 for the region identified as "Tension." In the intermediate region between these two regions, the curve is generally non-linear. This is at least partially because the threaded connection 120 is volatile at low loads since the load distribution among the threads changes as the lower end 132 (FIG. 2C) of the threaded pin connector 102a engages and separates from the primary load shoulder 130.

Beginning at the preload (at the center of the curve), as compressive or tensile loads are applied, local deflection occurs and more or fewer of the threads can engage one another. The load is then redistributed more or less evenly among the threads. As the load increases further, the relationship between the peak stress and the applied load stabilizes and the system is said to reach a "steady state." Since the non-linear region of the curve describes the less predictable behavior of the threaded connector, a graphical diagram of the focused on the non-linear can be useful to a second user 116.

The Elastic-Plastic Analysis

Referring now to FIGS. 12 and 13, a loading sequence of the elastic-plastic analysis of step 206 (FIG. 3B) is described. The loading sequence is applied twice for each of the sub-steps 206A through 206E; once in a tensile context and once in a compressive context. The first load step listed in the table of FIG. 12 is the preload "$F_p$" discussed above, which is applied to the virtual model to simulate the internal loads experienced by the threaded connection 120 due to the engagement of the threaded pin and box connectors 102a, 104a. This preload "$F_p$" is represented as zero on the vertical axis of FIG. 13 indicating that the preload "$F_p$" is included in each of the "Applied loads" for the remainder of the load steps 2 through 14.

Figure 3B:
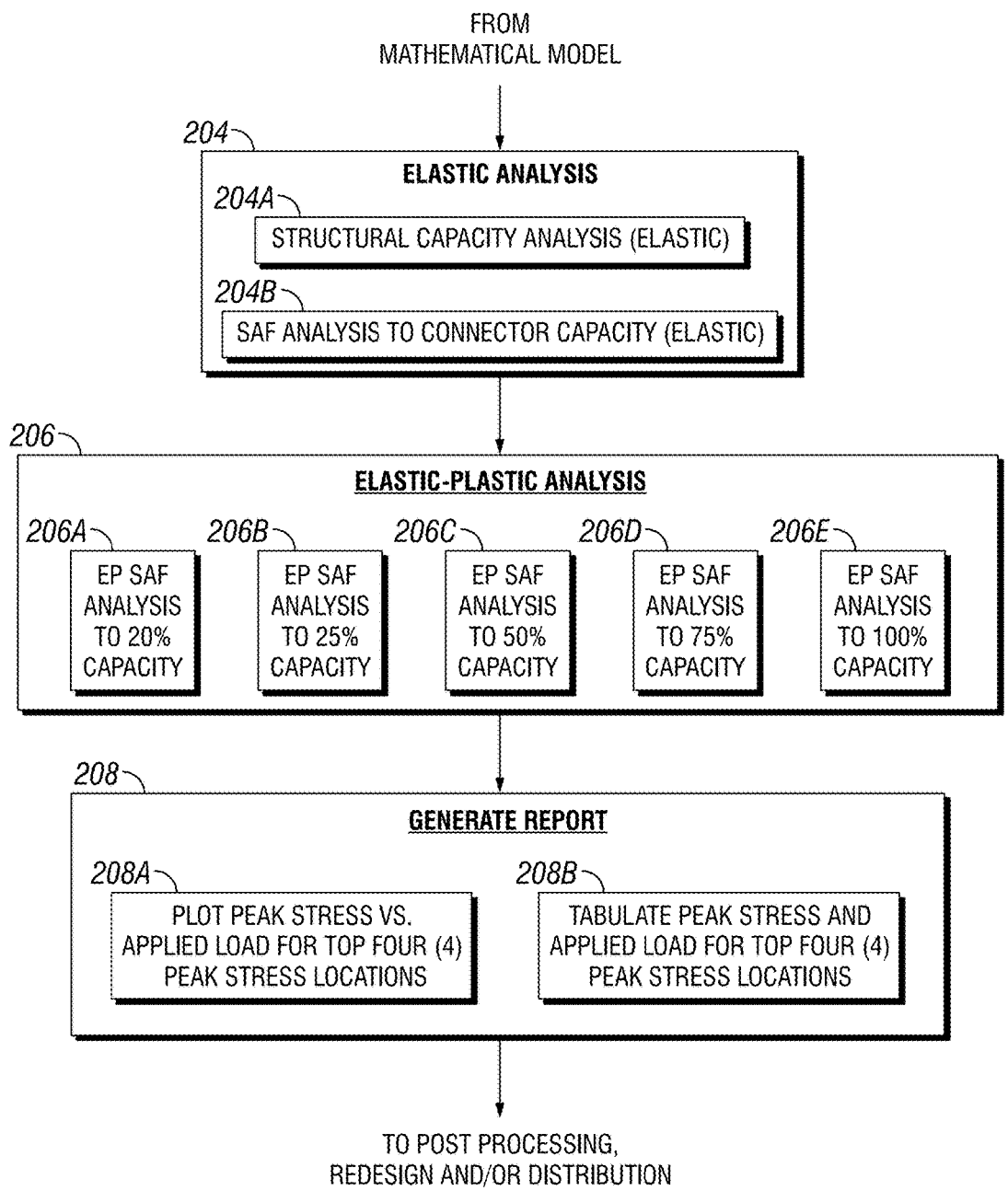
FIG. 3B is a flow diagram illustrating of details of the elastic analysis, elastic-plastic analysis and report generating step of FIG. 3A.

The second load step listed in FIG. 12 is a "Peak Load." The peak load is a predetermined portion or percentage of the capacity of the threaded connection as indicated in sub-steps 206A through 206E (FIG. 3B). Sub-step 206E represent a full-capacity elastic-plastic analysis since the peak load is a full 100% of the tensile and/or compressive capacity determined in the structural capacity analysis of step 204A. Each sub-step 206A through 206D represents a partial-capacity elastic-plastic analysis since the peak load is a predetermined percentage of the capacity. In the embodiment illustrated, the predetermined percentages include 20%, 25%, 50% and 75% of the capacity.

Each of the sub-steps 206A through 206E includes both a compressive analysis and a tensile analysis where the "Peak Load" is the predetermined portion or percentage of the respective compressive and tensile capacity as listed. Thus 10 separate loading sequences are performed in step 206. In the second load step in the loading sequence for sub-step 206A, for example, the virtual model is loaded to 20% of the yield capacity determined in sub-step 204A as discussed above. In load step 3 of the loading sequence, the Peak Load of load step 2 is relieved from the virtual model. If any plastic deformation results from the application of the Peak Load applied in load step 2, the geometry of the virtual model is accordingly re-arranged when the virtual model is unloaded in load step 3.

The virtual model is loaded and unloaded twice more in load steps 4 through 7. Any plastic deformation occurring in first seven load steps results in rearrangement of the geometry of the virtual model. Load steps 8 through 14 are then applied sequentially to the virtual model. Load steps 8 through 14 each represent a portion of the "Peak Load" according to the non-zero "factors" listed in the table of FIG. 5B. Thus, in load step 8, a load equal to 0.0125 times the "Peak load" of load steps 2, 4 and 6. Similarly, in load step 14, the "Peak Load is applied since the "factor" associated with load step 14 is one. In some embodiments, load steps 8 through 14 include loading the re-arranged virtual model to the respective predetermined percentages the sequence of load steps of the elastic analysis of step 204B.

In each of the load steps 8 through 14, a stress distribution such as those illustrated in FIGS. 14 and 15 are examined. The peak stresses at the four selected locations described above (at pin thread-1, pin thread-14, box thread-2 and pin thread-2) are extracted and tabulated in a table similar to FIG. 9 described above. Similarly, the stress distributions can be examined to determine the proportion of the applied load transmitted through each of the engaged threads.

Figure 16A:
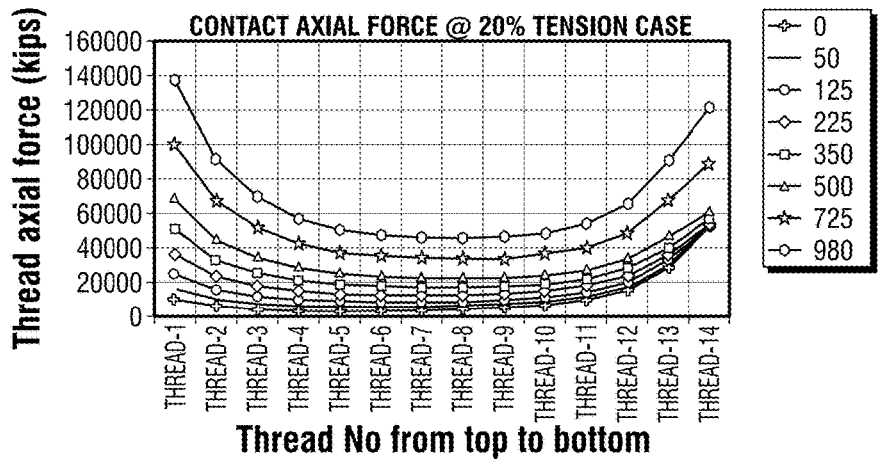
FIGS. 16A through 16E are graphical views illustrating a portion of the simulated loads transmitted through each of the fourteen threads of the connector portion of the virtual model of FIGS. 4A and 4B for each of the last seven load steps in the loading sequences of FIGS. 12 and 13 in a tensile context.
Figure 16B:
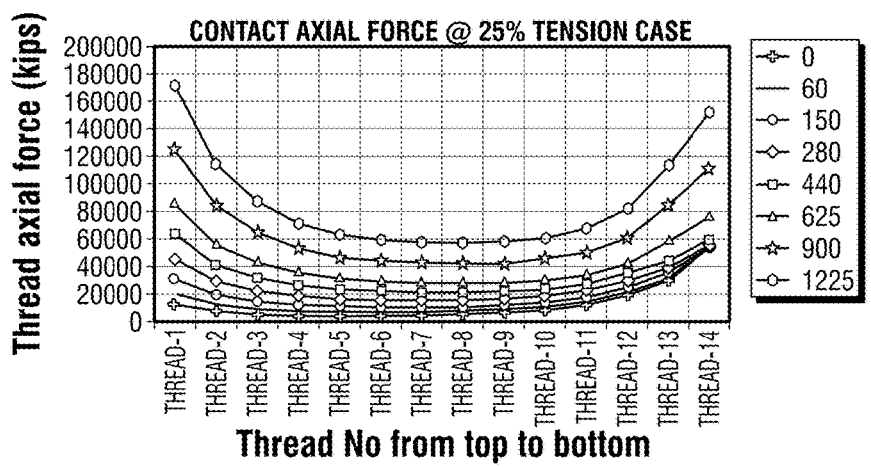
Figure 16C:
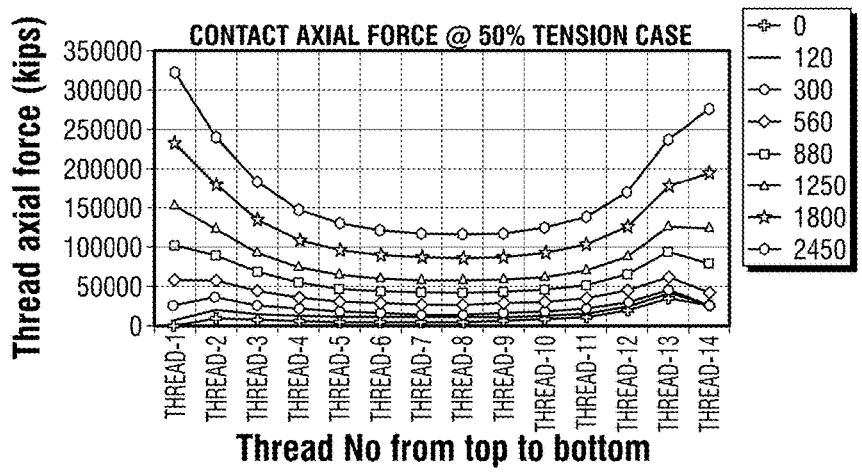
Figure 16D:
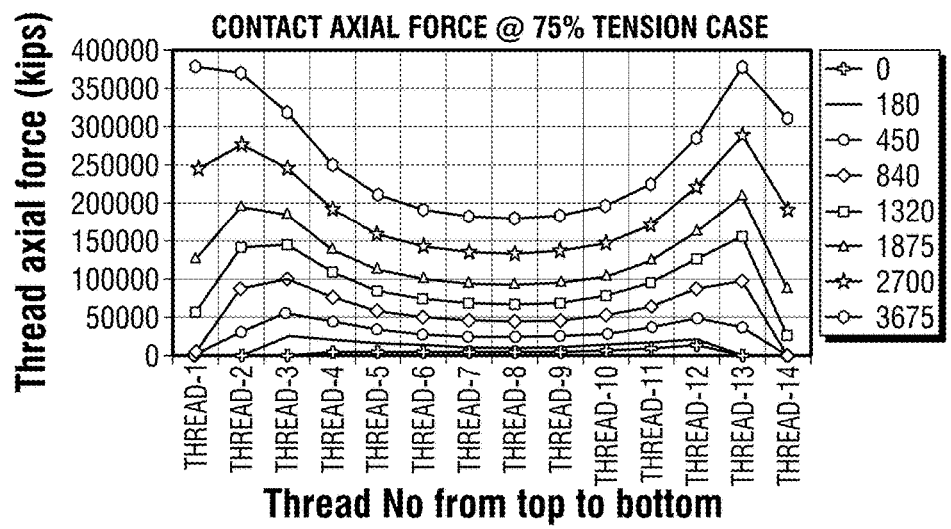
Figure 16E:
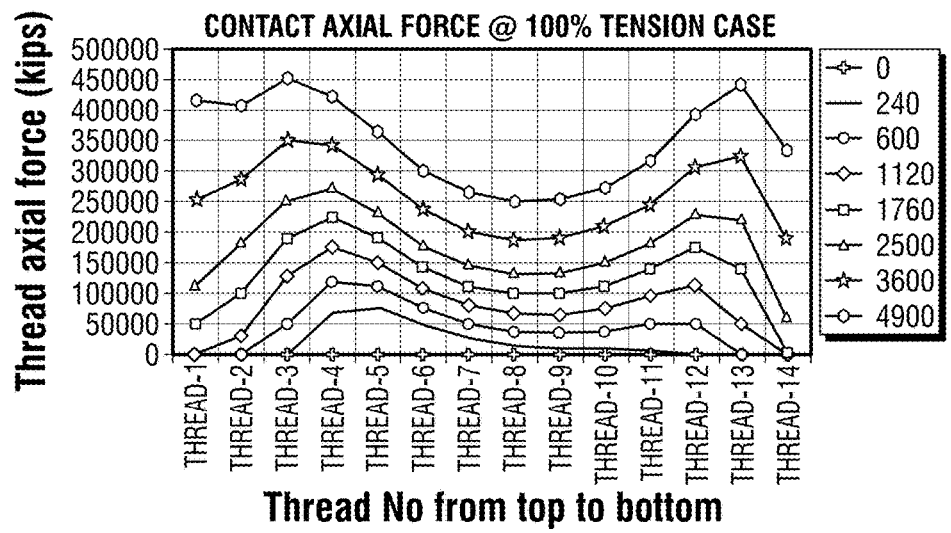

The portions of the applied tensile load transmitted through each thread are plotted in FIGS. 16A through 16E for each of the sub-steps 206A though 206E. Each plot includes an individual curve for each of the load steps 8 through 14 of the loading sequence of FIG. 12. The applied load for each curve and corresponding load step is indicated at the right. As illustrated in FIG. 16A where the "Peak Load" applied is 20% of the tensile capacity of the threaded connection 120, the uppermost threads (thread-1 and tread-2) and the lower-most threads (thread-13 and thread-14) transmit the greatest portions of the applied loads. Since little or no plastic deformation is expected when only 20% of the tensile capacity is applied to the threaded connection 120, the curves illustrated in FIG. 16A are similar in shape to the curves illustrated in FIG. 8A of the elastic analysis described above. As greater portions of the tensile capacity are applied, plastic deformations occurring in the load steps 2 through 7 cause a redistribution of the applied load among the threads. Thus, as illustrated in FIG. 16E, for example, the uppermost threads and the lower-most threads transmit a lower proportion of the applied load when a full 100% of the tensile capacity is applied to the virtual model.

Figure 17A:
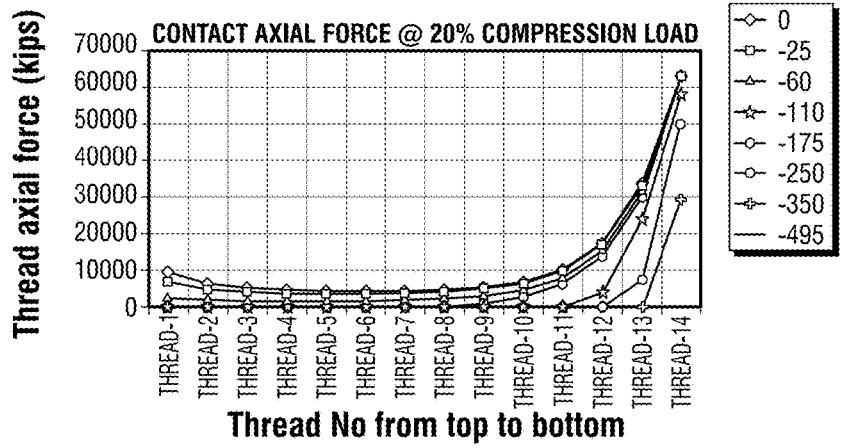
FIGS. 17A through 17E are graphical views illustrating a portion of the simulated loads transmitted through each of the fourteen engaged threads of the connector portion of the virtual model of FIGS. 4A and 4B for each of the last seven load steps in the loading sequences of FIGS. 12 and 13 in a compressive context.
Figure 17B:
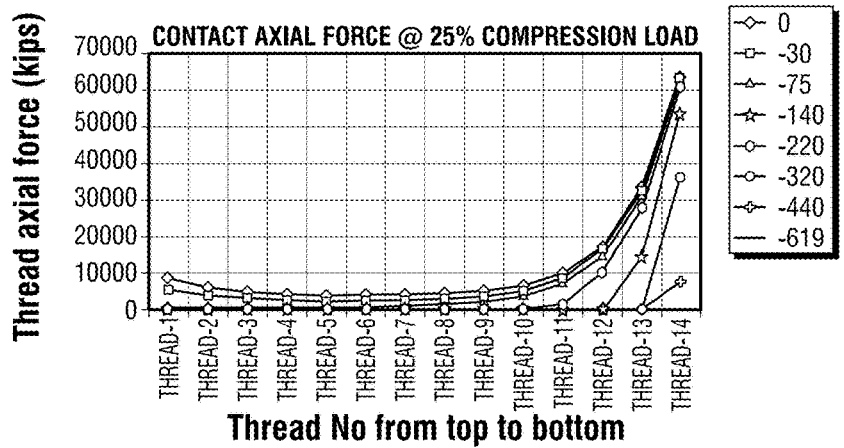
Figure 17C:
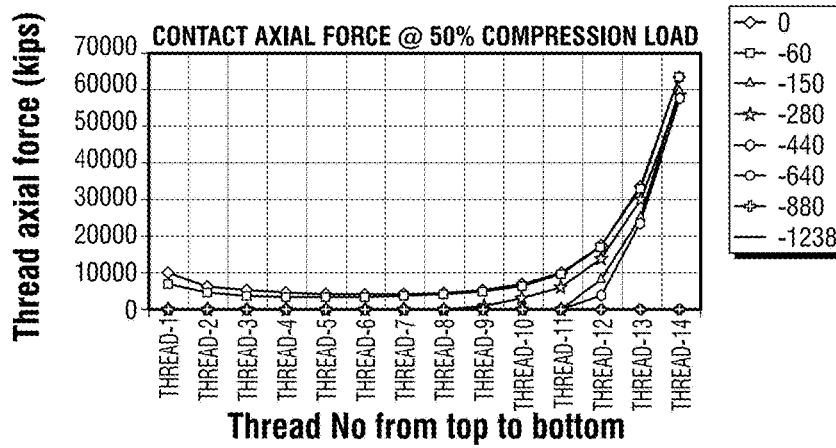
Figure 17D:
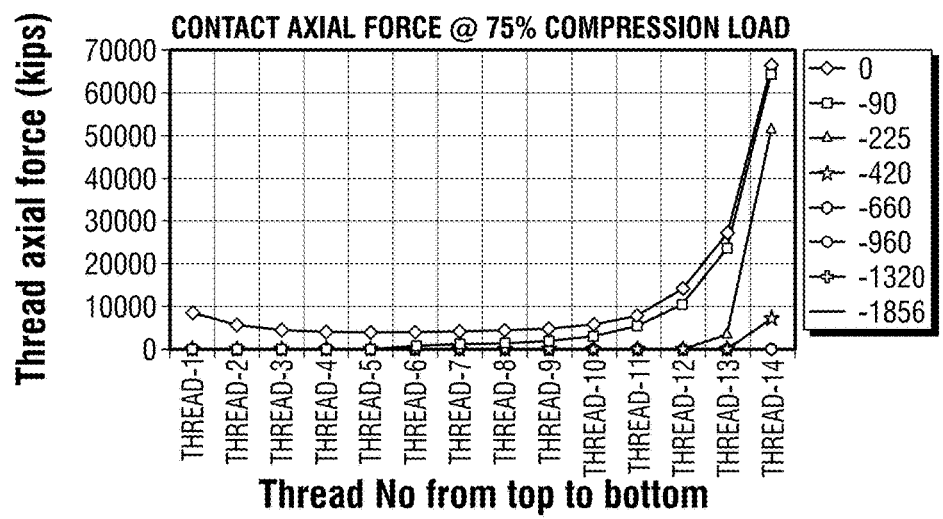
Figure 17E:
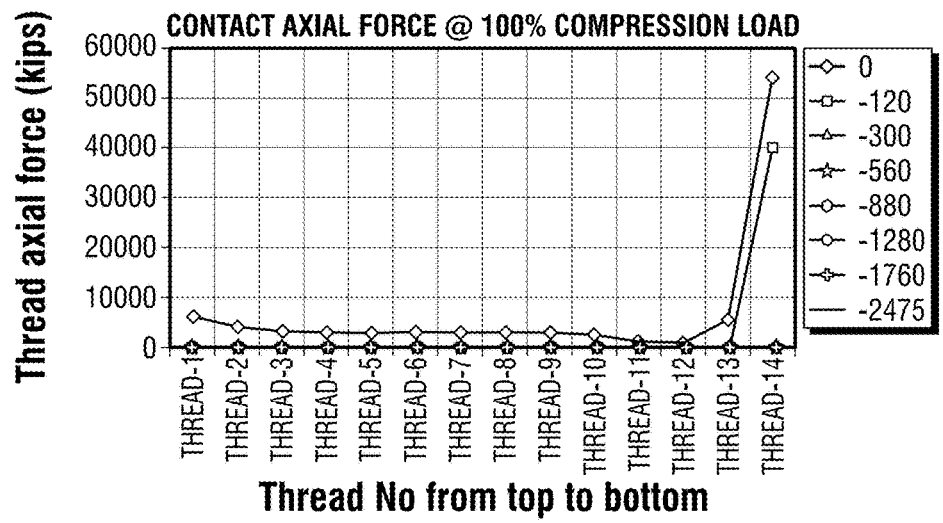

As illustrated in FIG. 17A, the portions of the applied compressive load transmitted through each thread are plotted for each of load steps 7 through 14 (FIG. 12) of sub-step 206A (FIG. 3B). Since the "Peak Load" applied is only 20% of the compressive capacity of the threaded connection 120, little plastic deformation is expected, and the general shape of the curves illustrated is similar to the general shape of the curves illustrated in FIG. 8B of the elastic analysis described above wherein the lower-most threads (thread-13 and thread-14) transmit the greatest portions of the applied loads. As illustrated in FIGS. 17B through 17E, as greater percentages of the compressive capacity is applied, greater amounts of plastic deformation is expected in the threads. The plastic deformation causes a lower portion of the applied load to be transmitted through the threads, and a higher portion of the applied load to be transmitted through the load shoulder 130 (FIG. 2C). For example, as illustrated in FIG. 17E, only the curves representing load step 7 (with an applied load of zero) and load step 8 (with an applied load of −120 kips) indicate a non-zero load transmitted through the threads. For load step 9 (applied load of −300 kips) through load step 14 (with an applied load of −2475 kips) the corresponding curves all lie along the horizontal axis (zero thread axial force).

Figure 18A:
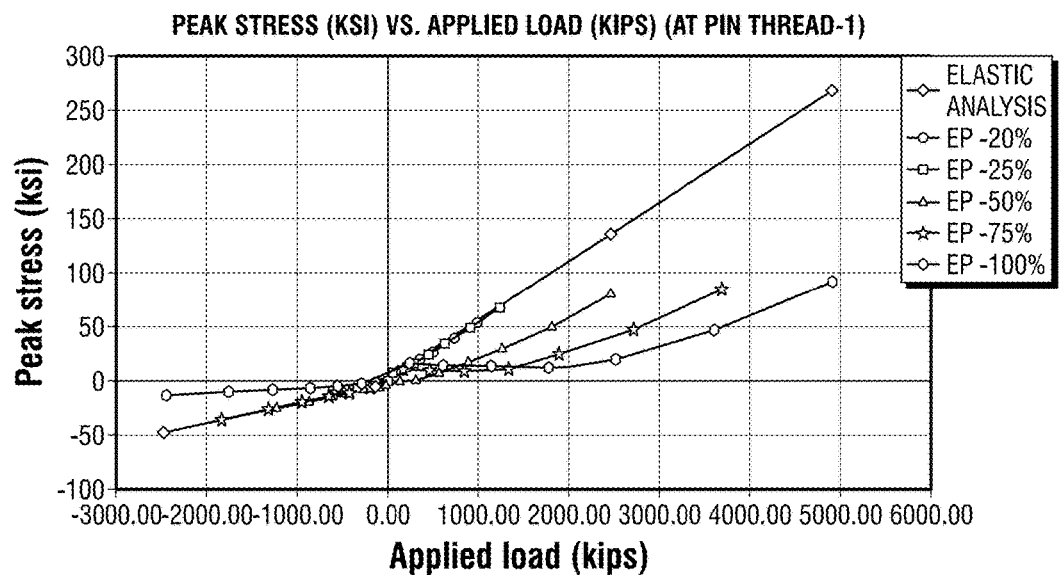
FIGS. 18A through 18D are graphical diagrams illustrating peak stresses plotted against the simulated applied loads of the elastic and elastic-plastic analyses of FIG. 3.
Figure 18B:
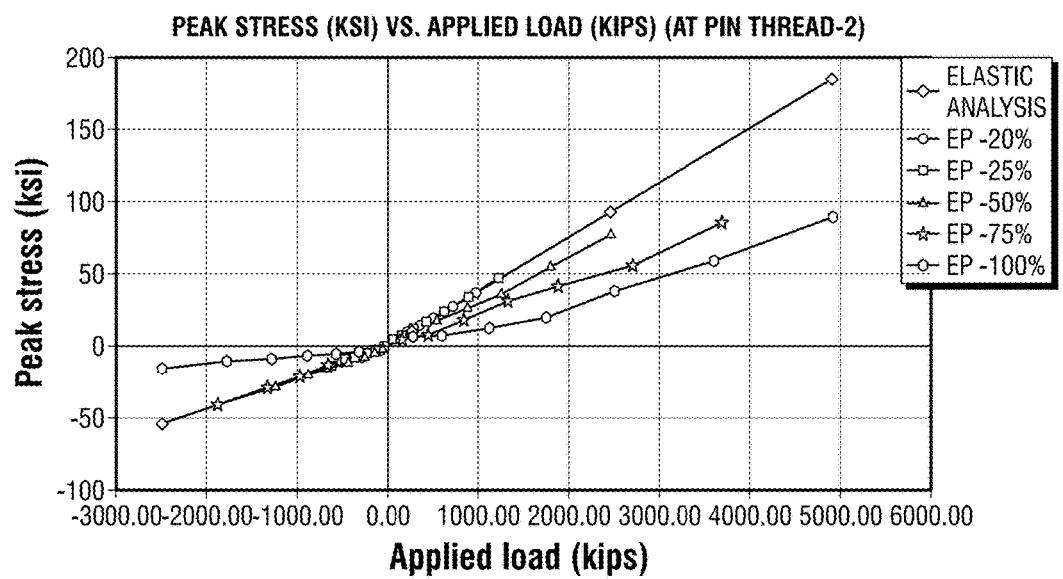
Figure 18C:
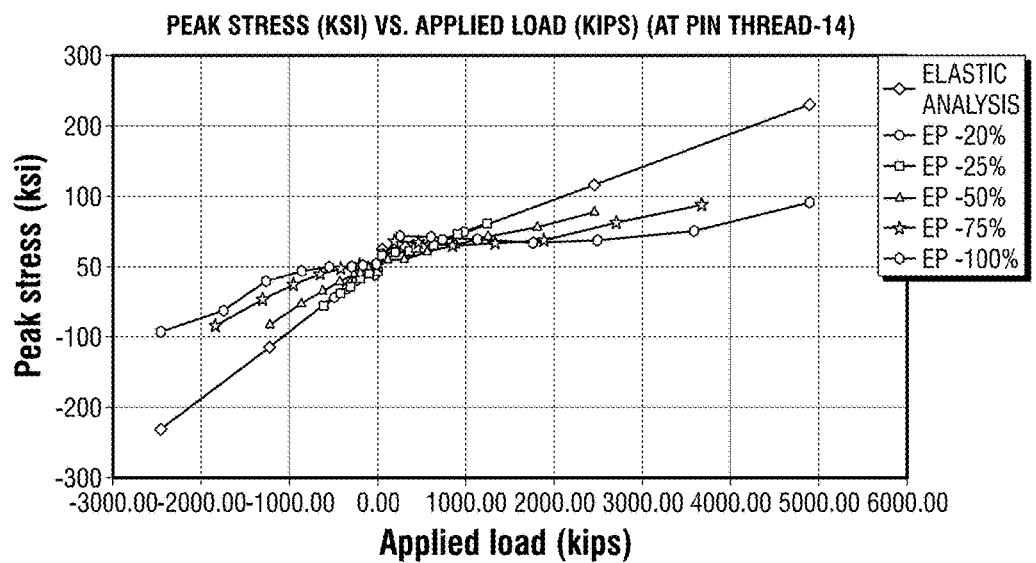
Figure 18D:
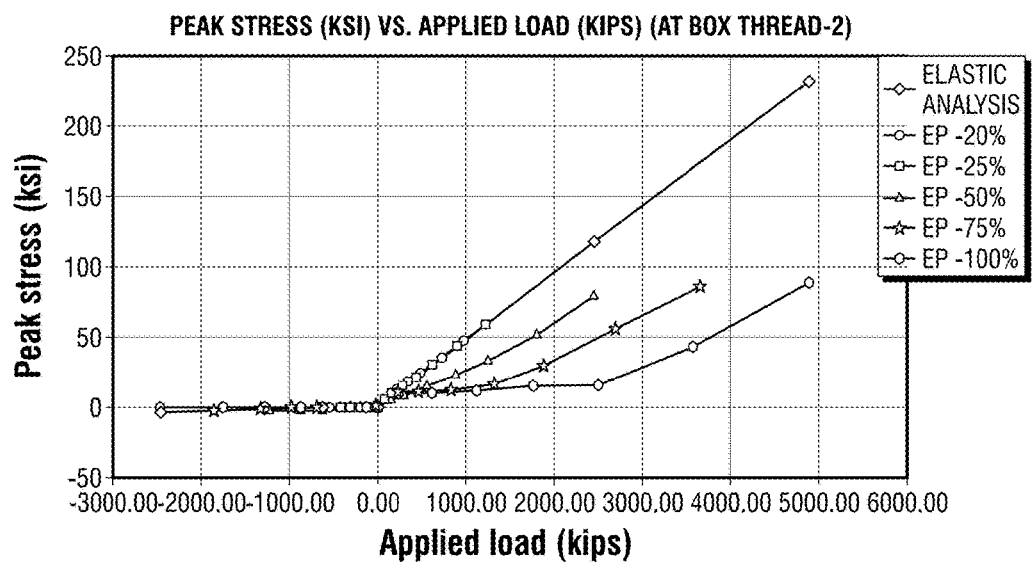

As illustrated in FIGS. 18A through 18D, the applied load is plotted against the peak stresses identified at the four selected locations, i.e, pin thread 1 (FIG. 18A), pin thread 2 (FIG. 18B), pin thread 14 (FIG. 18C) and box thread 2 (FIG. 18D). The peak stresses are extracted from the stress distributions generated from load steps 7 through 14 (FIG. 12) of sub-steps 206A through 206E (FIG. 3B). A separate curve represents the peak stresses identified in each of the sub-steps 206A through 206E. Additionally, a separate curve representing the peak stresses identified in the elastic analysis for the corresponding locations are plotted in FIGS. 18A through 18D. In each case, the elastic analysis represents the greatest peak stress identified. Including the curves from both the elastic and elastic plastic analyses illustrates how the plastic deformation redistributes the applied loads among the threads such that the load is distributed more evenly over the entire threaded profile and lower stresses are generated in particular threads.

Figure 19:
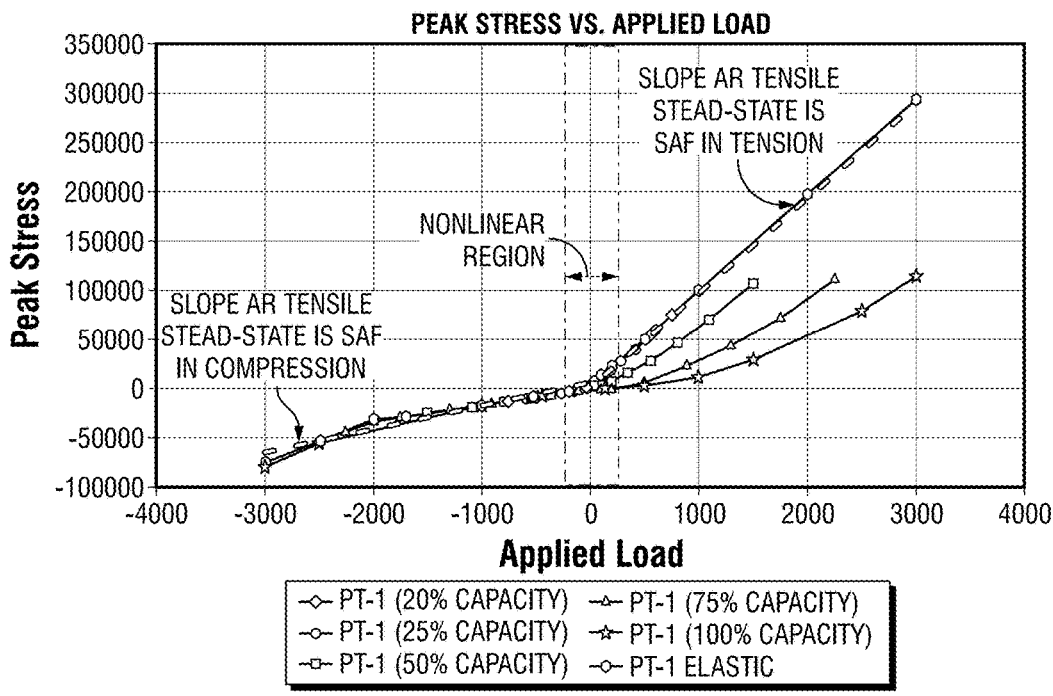
FIGS. 19 and 20 are graphical diagrams illustrating alternate methods of determining a stress amplification factor from a slope of a curve generated from the elastic analysis.
Figure 20:
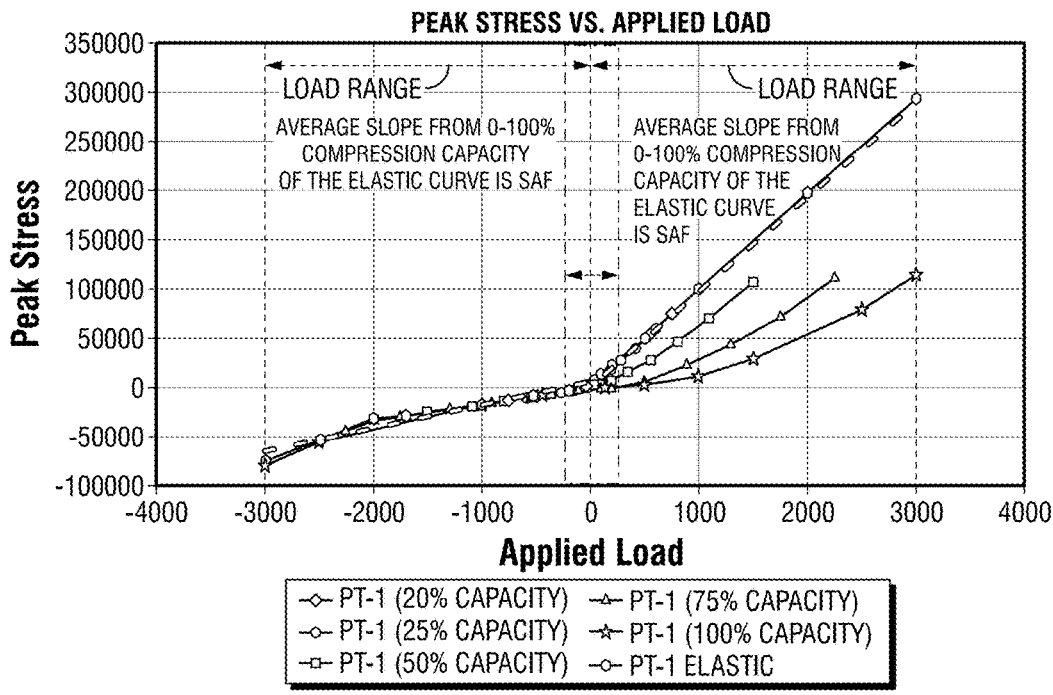

Referring to FIGS. 19 and 20, two methods of determining SAF values for the threaded connection 120 are illustrated. As illustrated in FIG. 19, the slope of the elastic curve in the steady state or generally linear regions can be determined to produce an SAF value for both the compressive and tensile loading for the particular location within the threaded connection. Alternatively, as illustrated in FIG. 20, an SAF value can be calculated as an average slope of the elastic curve over the entire load range from zero or the preload to the respective tensile and compressive capacities.

Generate the Report

Once the elastic analysis and the elastic-plastic analyses are performed, a report is generated in step 208. The report can include a graphical diagram similar to FIG. 18A including a plot of a curve representing the peak stresses versus the simulated applied forces or loads applied at each of the load steps for each of the elastic analysis of step 204B (FIG. 3B), the full-capacity elastic-plastic analysis if step 206E and each partial-capacity elastic-plastic analysis of steps 206A through 206D. The report can include a similar graphical diagram for each one of the top four peak stress locations or the plurality of locations selected for analysis (step 208A in FIG. 3B).

The report can also include a tabular diagram of the peak stresses and applied loads determined at each of the top four peak stress locations or the plurality of locations selected for analysis (step 208B in FIG. 3B). In some embodiments, the tabular diagram can include other information such as connector alternating stresses, pipe alternating stresses and stress amplification factors as indicated in FIG. 9.

Once the report is generated, the first user 106 can evaluate the report to determine whether any post-processing is or further analysis is required or whether the report is suitable to be communicated to the second user 116 (FIG. 1). The second user 116 can review the report and determine which curve or table provided therein most similarly describes the expected loading conditions of the first and second tubular members 102, 104 for a particular purpose, and thereby evaluate the suitability of the particular design of the first and second tubular members 102, 104 to the particular purpose.

While the invention has been shown or described in only some of its forms, it should be apparent to those skilled in the art that it is not so limited, but is susceptible to various changes without departing from the scope of the invention.

What is claimed is:

1. A computer-implemented method of characterizing an operating performance of first and second tubular members that are connectable to one another by a threaded pin connector and a threaded box connector defined respectively thereon, the method comprising:
  receiving by a computer, a virtual model of the first and second tubular members connected to one another by the threaded pin connector and the threaded box connector;
  applying by the computer at least one first simulated force to the virtual model, the at least one first simulated force sufficient to induce a simulated plastic deformation in at least one of the first and second tubular members of the virtual model;
  relieving by the computer the at least one first simulated force from the virtual model such that a portion of a geometry of the virtual model is rearranged by the plastic deformation;
  applying by the computer at least one second simulated force to the virtual model; and
  identifying by the computer at least one peak stress in the virtual model induced by the at least one second simulated force.

2. The computer-implemented method of claim 1, wherein the computer has a non-transitory computer memory with a computer code stored thereon, the computer code being operable to determine a stress and strain distribution in the virtual model corresponding to simulated forces applied thereto.

3. The computer-implemented method of claim 1, wherein the step of identifying the at least one peak stress includes identifying a peak stress at an uppermost engaged thread of the pin connector.

4. The computer-implemented method of claim 1, wherein the step of identifying the at least one peak stress includes identifying a peak stress at one or more of the following selected locations: a thread on the threaded pin connector; a thread on the threaded box connector; a weld defined between the threaded pin connector and a pipe portion of the first tubular member; and a weld defined between the threaded box connector and a pipe portion of the second tubular member.

5. The computer implemented method of claim 4, further comprising the step of determining at least one capacity of a threaded connection, and wherein the at least one capacity includes at least one of a tensile elastic capacity and a compressive elastic capacity.

6. The computer-implemented method of claim 5, wherein the step of applying at least one first simulated force to the virtual model includes repeatedly applying a peak load to the virtual model, wherein the peak load represents a percentage of the at least one capacity.

7. The computer implemented method of claim 6, wherein the at least one second simulated force includes a plurality of second forces, and wherein the plurality of second forces define a predetermined sequence of load steps wherein each load step represents a factor of the peak load.

8. The computer implemented method of claim 7, wherein the sequence of load steps includes a load step representing a factor of zero times the peak load, a load step representing a factor of one times the peak load, and at least one load step representing an intermediate factor of the peak load, wherein the intermediate factor is between zero and one.

9. The computer implemented method of claim 8, further comprising, for each load step, determining a peak alternating stress within the threaded connection and a pipe alternating stress within a pipe portion of the first tubular member.

10. The computer implemented method of claim 9, further comprising the step of generating a report including a graphical diagram including a plot of a curve representing the peak stresses versus the simulated forces applied at each of the load steps.

11. The computer implemented method of claim 10, further comprising the step of determining a stress amplification factor defined by a slope of the curve over a selected range of the simulated forces applied.

12. The computer implemented method of claim 11, further comprising determining a generally linear range of the curve, and a generally non-linear range of the curve, and wherein the selected range of the simulated forces applied includes one of the generally linear range of the curve and a combination of both the linear and non-linear ranges of the curve.

13. The computer implemented method of claim 10, further comprising the step of performing an elastic analysis on the virtual model, wherein the elastic analysis includes the steps of:
  applying a sequence of simulated loads to the virtual model equal to the plurality of second forces;
  determining a simulated stress distribution in the virtual model for each of the sequence of simulated loads assuming a hypothetical fully elastic response to simulated loads;
  determining a peak stress at the one or more selected locations for each of the sequence of simulated loads; and
  plotting an elastic curve on the graphical diagram wherein the elastic curve represents the peak stresses determined in the elastic analysis versus the simulated forces applied at each of the load steps.

14. The computer implemented method of claim 13, wherein the report further includes a tabular diagram including each of the load steps and the peak stresses determined at each of the respective load steps.

15. A computer-implemented method of characterizing an operating performance of first and second tubular members that are connectable to one another by a threaded pin connector and a threaded box connector defined respectively thereon to form a threaded connection, the method comprising the steps of:
receiving by a computer a virtual model into of the first and second tubular members connected to one another by the threaded pin connector and the threaded box connector;
performing by the computer a structural capacity analysis on the virtual model to determine an elastic capacity of the virtual model;
performing by the computer an elastic analysis on the virtual model, the elastic analysis including:
applying a sequence of load steps to the virtual model wherein each load step of the sequence of load steps represents a factor of the elastic capacity;
determining a simulated stress distribution in the virtual model for each load step of the sequence of load steps assuming a hypothetical fully elastic response to simulated loads; and
determining a peak stress at one or more selected locations within the threaded connection for each load step of the sequence of load steps; and
performing by the computer an elastic-plastic analysis on the virtual model, the elastic-plastic analysis including:
applying at least one first simulated force to the virtual model, the at least one first simulated force sufficient to induce a simulated plastic deformation in at least one of the first and second tubular members of the virtual model;
relieving the at least one first simulated force from the virtual model such that a portion of a geometry of the virtual model is rearranged by the simulated plastic deformation;
applying a sequence of simulated second forces to the virtual model wherein the sequence of second forces corresponds to the sequence of load steps of the elastic analysis; and
identifying a peak stress in the rearranged virtual model at each of the one or more selected locations induced by each of simulated second force of the sequence of second simulated forces.

16. The computer-implemented method of claim 15, wherein the step of performing a structural capacity analysis on the virtual model includes the steps of:
applying an incremental sequence of simulated loads to the virtual model;
analyzing a stress distribution of the virtual model corresponding to each simulated load of the incremental sequence until a predetermined criteria is observed; and
defining the elastic capacity as the simulated load that induced the predetermined criteria.

17. The computer-implemented method of claim 16, wherein the predetermined criteria includes an average stress observed in the virtual model is greater than a yield strength of the virtual model.

18. The computer-implemented method of claim 15, further comprising the step of performing at least one partial-capacity elastic-plastic analysis on the virtual model, the at least one partial-capacity elastic-plastic analysis including:
applying the at least one first simulated force to the virtual model;
relieving the at least one first simulated force from the virtual model;
applying a sequence of simulated third forces to the virtual model wherein the sequence of third forces corresponds to a predetermined percentage of the sequence of load steps of the elastic analysis; and
identifying a peak stress in the rearranged virtual model at each of the one or more selected locations induced by each of the simulated third forces of the sequence of third simulated forces.

19. The computer-implemented method of claim 18, wherein the at least one partial-capacity elastic-plastic analysis includes a plurality of partial-capacity elastic-plastic analyses wherein the predetermined percentages for each respective partial-capacity elastic-plastic analysis includes 20%, 25%, 50% and 75% of the sequence of load steps of the elastic analysis.

20. The computer-implemented method of claim 19, further comprising the step of generating a report including a graphical diagram including a plot of a curve representing the peak stresses versus the simulated forces applied at each of the load steps for each of the elastic analysis, elastic-plastic analysis and each partial-capacity elastic-plastic analysis.

21. The computer-implemented method of claim 20, further comprising determining a stress amplification factor defined by a slope of the curve for the elastic analysis over a selected range of the simulated forces applied, and wherein the report further includes the stress amplification factor.

* * * * *